Dec. 5, 1967 F. HULLIGER 3,356,464
SEMICONDUCTORS AND DEVICES EMPLOYING THE SAME
Filed Aug. 30, 1963
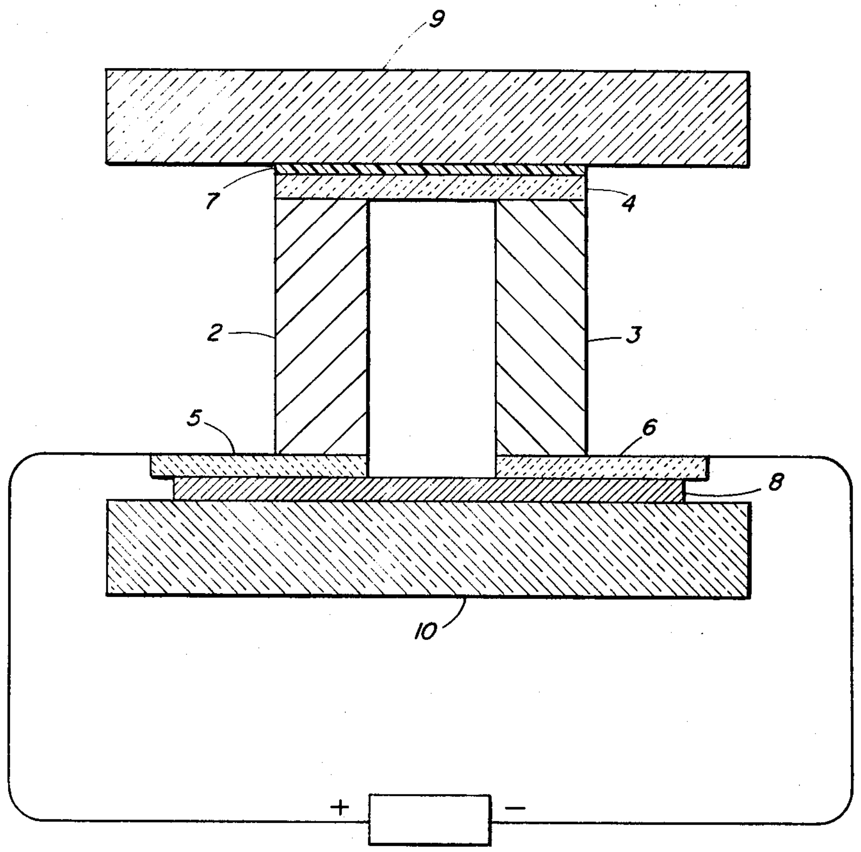
INVENTOR.
FRITZ HULLIGER
BY John E. Hawkins
ATTORNEY 3,356,464
Patented Dec. 5, 1967

3,356,464

SEMICONDUCTORS AND DEVICES EMPLOYING THE SAME

Fritz Hulliger, Uerikon, Zurich, Switzerland, assignor to American Cyanamid Company, Stamford, Conn., a corporation of Maine Filed Aug. 30, 1963, Ser. No. 305,601
8 Claims. (Cl. 23—315)

This invention relates to semiconducting compounds and their use in solid state semiconductor devices. More particularly, the present invention relates to the use of binary and ternary phases or compounds containing transition elements in solid state semiconductor devices.

Solid state semiconductor devices are in general well known and are characterized by a body, in most cases crystalline or even monocrystalline, of an electrically conducting substance which is subjected to electrical or magnetic fields, to corpuscular or wave radiation, or to a plurality of such phenomena for producing electrical, photoelectrical, optical or other physical effects. Typically, such devices include transistors, thermistors, rectifiers, diodes, photocells, photoconductors, radiation detectors, thermocouples, thermoelectric generators, and Peltier cooling cells, among others.

It is the principal object of this invention to provide solid state semiconductor devices employing intermetallic transition element compounds, some of which are known and some of which are novel and to provide new devices heretofore unavailable.

This and other objects and advantages of the invention will become more apparent from the detailed description thereof set forth hereinbelow in conjunction with the accompanying drawing, the single feature of which is in plan view, and demonstrates the use of semiconductors of this invention in a thermoelectric device.

According to this invention, a semiconductor device is provided comprising a semiconducting element and circuit means electrically connected therewith, which element comprising a compound of the formula $$M\ X\ Y$$

where M is selected from the group consisting of Rh and Ir, X and Y are selected from the group consisting of P, As and Sb, and may be identical or different elements.

More specifically, this invention relates to such a semiconductor device employing as a semiconducting element $$M\ X_a\ Y_b$$

where M is Rh or Ir; X is P, As or Sb; Y is As or Sb; and where $a$ is 1 or 2 and $b$ is 0 or 1, except that when $a$ is 2, $b$ is 0, and when $a$ is 1, $b$ is 1 and provided that when $a$ and $b$ are 1, X and Y, they are different elements.

Among the semiconducting compounds of the class exemplified by the above formula, the following are illustrative: $RhP_2$, RhPAs, $RhAs_2$, RhAsSb, $RhSb_2$, IrP, IrPAs, IrAsSb and $IrSb_2$.

The transition element compounds of this invention may be prepared by fusing or by sintering pressed pellets. In the fusing if compounds, the elements in stoichiometric quantities are thoroughly mixed, placed in a crucible and heated above the melting point for several minutes. In the sintering of the compounds, the powdered components of the elements in stoichiometric amounts are pressed into pellets of 8 millimeters in diameter by applying a pressure of about 5 tons. The pellets are then heated in evacuated sealed quartz tubes at temperatures of from 700 to 950° C. for as long as one or two months. In many instances, this sintering procedure was sufficient to obtain homogeneous samples in the form of gray dense pellets. Normally, the quality of the pellets can be improved by regrinding and resintering the pellets prepared in an initial run.

In order to illustrate the preparation of the semiconductors employed in the present invention, the following examples are given primarily by way of illustration. No specific details or enumerations contained therein should be construed as limitations on the present invention except insofar as they appear in the appended claims. All parts and percentages are by weight unless otherwise specifically designated.

*Example 1*

In the preparation of 1/100 mole quantities of $RhAs_2$, 1.029 g. Rh powder of 99.9% purity and a particle size of less than 70$\mu$ was mixed intimately with 1.498 g. of arsenic powder of 99.99% purity and about the same particle size. The mixed powders were pressed into pellets of 9 mm. diameter with a pressure of 5 tons. These pellets were sealed into an evacuated quartz glass tube or ampoule of about 8.5–9 mm. inner diameter and of about 1.5 mm. wall thickness and heated within 4 days time up to 900° C., at which temperature it was held for three to four weeks.

This procedure yields a black powder which had to be pressed for use.

*Example 2*

In the preparation of RhAsSb, the procedure is the same as in Example 1 above, except that 1.029 g. Rh powder, 0.749 g. of As powder and 1.218 g. of Sb powder, all powders of 99.99% purity, were thoroughly mixed and heated to 950°–1000° C. and held at this temperature for three weeks and yielded a compact pellet.

*Example 3*

In the preparation of IrPAs in 1/100 mole quantities, the procedure is the same as in Example 1, except that Ir of 99.9% purity and 1.922 g. P technical grade, purified as described in G. Brauer (Handbuch der Präparativen Anorganischen Chemie, Ferdinand Enke Verlag, Stuttgart, Bd. 1, 1960, p. 466) and As of 99.99% purity, all elements as powders of less than 70$\mu$ in size, were mixed, heated slowly to 750° C., and held at this temperature for 2 months. The product was in powder form which had to be pressed for use.

*Example 4*

In the preparation of 1/100 mole of IrAsSb, exactly the same procedure was employed as was used in the preparation of RhAsSb in Example 2, except that the sintering time was 4 weeks at 1000° C.

Employing the procedures outlined and specifically reported in the examples above, the following compounds were prepared and the lattice parameters of their monoclinic unit cell and their Seebeck coefficients measured.

SEMICONDUCTING COMPOUNDS

| | S($\mu$V/° C.) | Type of Conductance | Lattice Constant | |
|---|---|---|---|---|
| $RhAs_2$ | (a) 80<br>(b) 300 | (p)<br>(n) | a=6.06 A<br>b=6.08 A<br>c=6.15 A | $\beta$=114.7° |
| RhAsSb | 60 | (p) | a=6.36 A<br>b=6.28 A<br>C=6.41 A | $\beta$=115.4° |
| IrPAs | ---------- | ---------- | a=6.06 A<br>b=6.07 A<br>c=6.16 A | $\beta$=113.2° |
| IrAsSb | (a) 50<br>(b) 250 | (p)<br>(p) | a=6.35 A<br>b=6.30 A<br>c=6.41 A | $\beta$=114.2° |

The lattice constants recorded in the above table were obtained by X-ray analyses which were carried out on a Siemens Kristalloflex 4 with a Goniometer.

The Seebeck coefficient was measured at room temperature by pressing a cold probe and a hot probe on the sample and measuring the resulting voltage and then calibrating against a substance of known thermoelectric power, in this case $SnSe_2$ (550 $\mu$v./° C.).

Since the electrical properties of some of the transition metal compounds contemplated for use in accordance with the invention may be affected by departure from exact stoichiometric conditions, raw materials of the highest purity should be employed. Influencing of the electric properties may be achieved deliberately, in some instances by the inclusion of various impurities or dopes, or intended departure from exact stoichiometry. In many instances, the compounds or phases contemplated may be produced in the form of crystals within or from a melt.

As is known, semiconductors which have successive zones of different electrical properties are of particular significance for various practical applications. For instance, a semiconductor crystal which in one zone is an excess electron (n-type) conductor and in the adjacent zone a defect-electron conductor (hole conductor, p-type) is in general suited as a rectifier. Further, a semiconductor having an excess electron conductance or n-type zone followed by a defect-electron conductance of p-type zone and again followed by a n-type zone is useful as a controllable resistor. In this respect, reference is made to those devices known as transistors.

As will be seen from the table above, the compounds identified demonstrate p-type conduction, although it will be noted that the compound $RhAs_2$ has been prepared having both n- and p-type conduction. Compounds or phases demonstrating p-type conduction may be combined with compounds known to demonstrate n-type conduction and employed in devices of the type identified above. In forming new semiconducting devices, the intermetallic transition element phases or compounds of this invention are introduced into the device so as to have both p- and n-type conductors therein, which device is connected to circuit means which are electrically connected therewith.

Illustratively, in a thermoelectric device, as for refrigeration by the Peltier effect, it is desired to use semiconductor materials of the highest possible electrical conductivity, the highest possible Seebeck coefficient, and the lowest possible thermal conductivity, so as to maximize the expression $$Z=\frac{S^2\sigma}{K}$$

where S is Seebeck coefficient, $\sigma$ is electrical conductivity, K is thermal conductivity and Z is the thermoelectric figure of merit, well known in the art to be the essential design parameter whose value is desired to be as large as possible.

In order to produce a thermoelectric device, both n- and p-type semiconductor materials are most desirably employed in combination. Referring to the drawing, an n-type semiconductor such as a doped $Bi_2Te_3$ 2 and a p-type semiconductor such as IrAsSb 3 are connected electrically by an electrical conductor connector 4. Electrical conductors 5 and 6 are attached to semiconductors 2 and 3, respectively, and to the positive and negative electrodes 2 and 3, respectively, and to the positive and negative electrodes of a DC power source. Thermally conductive electrical insulator 7 is in contact with electrical conductor 4 and cold junction 9 while thermally conductive electrical insulator 8 is in contact with electrical conductors 5 and 6 and hot junction 10. When DC electrical power of the proper polarity is applied to the conductors 5 and 6, heat will be withdrawn from the body 9 and transferred to the body 10. A number of such thermoelectric heat pumping elements may be connected together in series or parallel manner so as to provide heat pumping capacities for refrigerating devices capable of cooling small parts, such as power transistors, or large freezing units, such as domestic food freezers.

I claim:

1. A semiconductor device comprising a semiconducting element and circuit means electrically connected therewith, said semiconducting element being selected from the group consisting of MAsSB and MPAs wherein M is Ir or Rh.

2. The semiconductor device of claim 1 wherein the semiconducting element is RhAsSb.

3. The semiconductor device of claim 1 wherein the semiconducting element is IrPAs.

4. The semiconductor device of claim 1 wherein the semiconducting element is IrAsSb.

5. As a new composition of matter a semiconductor selected from the group consisting of MAsSb and MPAs wherein M is Ir or Rh.

6. The composition of claim 5 which is RhAsSb.

7. The composition of claim 5 which is IrAsSb.

8. The composition of claim 5 which is RhPAs.

References Cited

UNITED STATES PATENTS

| | | | |
|---|---|---|---|
| 2,944,975 | 7/1960 | Folberth | 23—315 |
| 3,023,079 | 2/1962 | Kulifay | 23—204 |
| 3,211,517 | 10/1965 | Castellion | 23—315 |

OTHER REFERENCES

Hansen: "Constitution of Binary Alloys," second ed., McGraw-Hill Book Co. Inc., New York, 1958, p. 176, 1087, 1154, 870, 167.

MILTON WEISSMAN, *Primary Examiner.*

OSCAR R. VERTIZ, *Examiner.*

H. S. MILLER, *Assistant Examiner.*